United States Patent [19]
Liaw

[11] Patent Number: 5,904,531
[45] Date of Patent: May 18, 1999

[54] METHOD OF INCREASING THE AREA OF A BURIED CONTACT REGION

[75] Inventor: Jhon-Jhy Liaw, Taipei, Taiwan

[73] Assignee: Taiwan Semiconductor Manufacturing Company, Ltd., Hsin-Chu, Taiwan

[21] Appl. No.: 08/933,369

[22] Filed: Sep. 19, 1997

[51] Int. Cl.[6] .................................................. H01L 21/336
[52] U.S. Cl. .......................... 438/296; 438/533; 438/655; 438/657; 438/305
[58] Field of Search ..................................... 438/305, 296, 438/533, 655, 657

[56] References Cited

U.S. PATENT DOCUMENTS

| | | | |
|---|---|---|---|
| 5,014,099 | 5/1991 | McElroy | 357/23.6 |
| 5,521,113 | 5/1996 | Hsue et al. | 437/52 |
| 5,525,552 | 6/1996 | Huang | 437/41 |
| 5,607,881 | 3/1997 | Huang | 437/195 |
| 5,843,816 | 7/1997 | Liaw et al. | 438/238 |

*Primary Examiner*—John F. Niebling
*Assistant Examiner*—David A. Zarneke
*Attorney, Agent, or Firm*—George O. Saile; Stephen B. Ackerman

[57] ABSTRACT

A process for forming an increased surface area, buried contact region, for a MOSFET device, has been developed. The process features creating a mini-trench, in an insulator filled shallow trench, exposing a vertical surface of the semiconductor substrate, along the side of the mini-trench. An angled, phosphorous, ion implantation procedure, creates a buried contact region along a top surface, as well as along the vertical surface of the semiconductor substrate, exposed in the mini-trench.

22 Claims, 4 Drawing Sheets

METHOD OF INCREASING THE AREA OF A BURIED CONTACT REGION

BACKGROUND OF THE INVENTION (1) Field of the Invention

The present invention relates to a method of fabricating a metal oxide semiconductor field effect transistor, (MOSFET), device, and more specifically to a process used to create a buried contact feature, for the MOSFET device.

(2) Description of Prior Art

The semiconductor industry is continually striving to improve the performance of MOSFET devices, while still attempting to maintain, or even to reduce the cost of manufacturing MOSFET devices. These objectives have been successfully addressed via micro-miniaturization, or the ability of the semiconductor manufacturing community to fabricate MOSFET devices with sub-micron features. The smaller features result in decreases in performance robbing, parasitic capacitances, as well as decreases in performance degrading resistances. In addition the sub-micron features allow comparable logic and memory functions to be obtained on smaller semiconductor chips, thus resulting in more semiconductor chips per starting substrate, thus reducing the cost of a specific MOSFET chip. Several semiconductor fabrication disciplines, such as photolithography and dry etching, have contributed to the trend to micro-miniaturization. For example the use of more sophisticated exposure cameras, as well as the use of more sensitive photoresist materials, have made the attainment of sub-micron images in photoresist layers, routine. In addition the development of more advanced dry etching tools have allowed the sub-micron images in photoresist layers to be successfully transferred to underlying materials, used for the fabrication of MOSFET devices.

In addition to the advances in specific fabrication disciplines, contributing to the attainment of sub-micron MOSFET devices, specific MOSFET structural developments have also played a role in successfully creating sub-micron MOSFET devices. For example the ability to contact the source and drain region of the MOSFET device, outside the active device region, has resulted in smaller MOSFET devices, thus creating higher performing and less expensive devices. The use of a buried contact process, featuring the placement of a doped region, adjacent to a source and drain region, and contacting this region via a polysilicon layer, has allowed the active device region of the MOSFET device to be decreased. The amount of area allotted to a buried contact region has to be minimized to satisfy the high density design objectives for static random access memory, (SRAM), designs. However the amount of contact area, between an underlying buried contact region, and an overlying contact layer, has to adequate, to avoid resistance problems, that can result in performance degradation.

This invention will present a process for increasing the contact area between a buried contact structure, and an overlying contact layer, by removing a portion of insulator, from an insulator filled, shallow trench, during the buried contact patterning process, followed by an angled, buried contact, ion implantation procedure, used to create the buried contact region. Subsequent polysilicon deposition, and patterning, creates a buried contact structure, to a buried contact region, in which the buried contact region is comprised of a region formed in the top surface of the semiconductor substrate, as well as a region of buried contact, formed on the sides of the semiconductor substrate, exposed in the shallow trench. Prior art, such as Huang, U.S. Pat. No. 5,607,881, describe a process of forming a crevice in the semiconductor substrate, followed by ion implantation of the buried contact spices, in the creviced region. However that prior art does not use a side of a shallow trench, for the increased surface area, nor does that prior art employ the angled ion implantation procedure, for formation of a buried contact region, on the exposed sides of the semiconductor substrate.

SUMMARY OF THE INVENTION

It is an object of this invention to increase the surface area of a buried contact region, by forming a buried contact region in the top surface of a region of the semiconductor substrate, as well as forming a buried contact region, along the side of the semiconductor substrate, exposed in a mini-trench.

It is another object of this invention to form a mini-trench in an insulator filled shallow trench, by removing a portion of insulator from the insulator filled shallow trench, exposing a side of the semiconductor substrate.

It is still another object of this invention to create the buried contact region, in a region of the top surface of the semiconductor substrate, as well as along the side of the semiconductor substrate, exposed in the mini-trench, via use of an angled, ion implantation procedure.

In accordance with the present invention a method is described for fabricating an increased surface area, buried contact region, for a MOSFET device, using a buried contact region comprised of a first region, in the top surface of the semiconductor substrate, and a second region, formed along the side of the semiconductor substrate, exposed in a mini-trench. After formation of an insulator filled, shallow trench region, a thin gate insulator layer is thermally grown, followed by the deposition of a first polysilicon layer. A buried contact opening shape is formed in a photoresist layer, followed by a dry etching procedure, used to transfer the buried contact opening shape to the overlying composite layer of first polysilicon and gate insulator, resulting in the exposure of a portion of the semiconductor substrate, as well as exposure of a portion of the insulator filled shallow trench. An insulator dry etch procedure is performed in the region of the insulator filled, shallow trench, exposed in the buried contact opening, creating a mini-trench in the insulator filled, shallow trench, and exposing a vertical side of the semiconductor substrate. After subjecting the buried contact photo shape to an isotropic etch back procedure, an angled phosphorous, ion implantation procedure is used to create a buried contact region in the semiconductor substrate, with the buried contact region comprised of a top surface region, as well as a vertical region, located on the side of the semiconductor substrate, exposed in the mini-trench. A second polysilicon layer, and a metal silicide layer, are next deposited, followed by photolithographic and dry etching procedures, used to form a gate structure, in the metal silicide, second polysilicon and first polysilicon layer, overlying the thin gate insulator, and also used to form a polysilicon contact structure, contacting the underlying, buried contact region. A lightly doped source and drain region is next formed between the polysilicon contact structure and the polysilicon gate structure, followed by the creation of insulator spacers on the sides of both the polysilicon contact structure, and polysilicon gate structure. Formation of a heavily doped region, between polysilicon structures, results in a conductive link between the buried contact region and source and drain regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of creating a MOSFET device, with an increased surface area, buried contact region, will now be described in detail. The method for creating the increased surface area, buried contact region, described in this invention, can be used for MOSFET devices that are currently being manufactured in industry, therefore only specific areas unique to understanding this invention will be featured. In addition the MOSFET device used with the increased surface area, buried contact region can be an N channel, (NFET), device, a P channel, (PFET), device, or in the case of SRAM designs, both NFET and PFET devices. For PFET devices, an N well region would be formed in a P type semiconductor substrate. However for this application the increased surface area, buried contact region will be described in a process used to create a NFET device.

Figure 1:
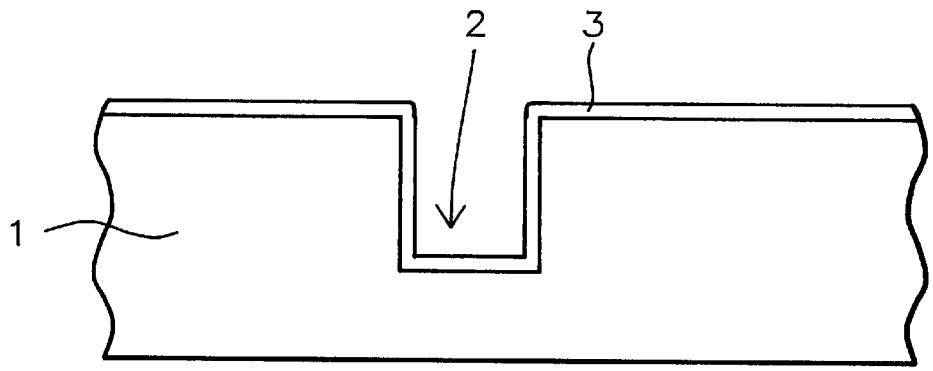
FIGS. 1–9, which schematically, in cross-sectional style, illustrate the stages of fabrication used to create a MOSFET device with an increased surface area, buried contact region.
Figure 2:
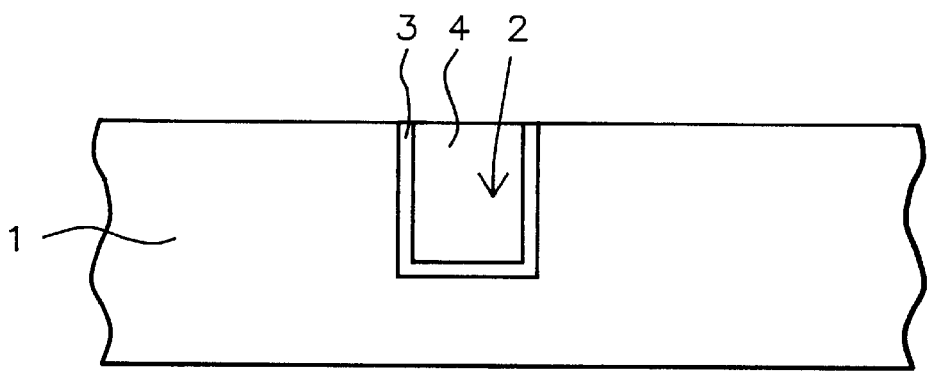

A semiconductor substrate, 1, composed of P type, single crystalline silicon, with a <100> crystallographic orientation, is used. A shallow trench 2, schematically shown in FIG. 1, is formed in semiconductor substrate 1, via conventional photolithographic procedures, and anisotropic, reactive ion etching, (RIE), using $Cl_2$ as an etchant. Shallow trench 2, is formed to a depth between about 3000 to 7000 Angstroms, with a width between about 0.20 to 100 uM. After removal of a masking photoresist layer, via oxygen plasma ashing and careful wet cleans, a silicon oxide layer 3, is thermally grown, to a thickness between about 100 to 1000 Angstroms, shown schematically in FIG. 1. An insulator layer 4, of silicon oxide, is next deposited using either plasma enhanced chemical vapor deposition, (PECVD), low pressure chemical vapor deposition, (LPCVD), or sub-atmospheric chemical vapor deposition, (SACVD), procedures, to a thickness between about 4000 to 8000 Angstroms, completely filling shallow trench 2. Insulator layer 4, residing outside shallow trench 2, is removed via chemical mechanical polishing, (CMP), or selective RIE procedures, also resulting in the removal of silicon oxide layer 3, from the top surface of semiconductor substrate 1. This is shown schematically in FIG. 2.

Figure 3:
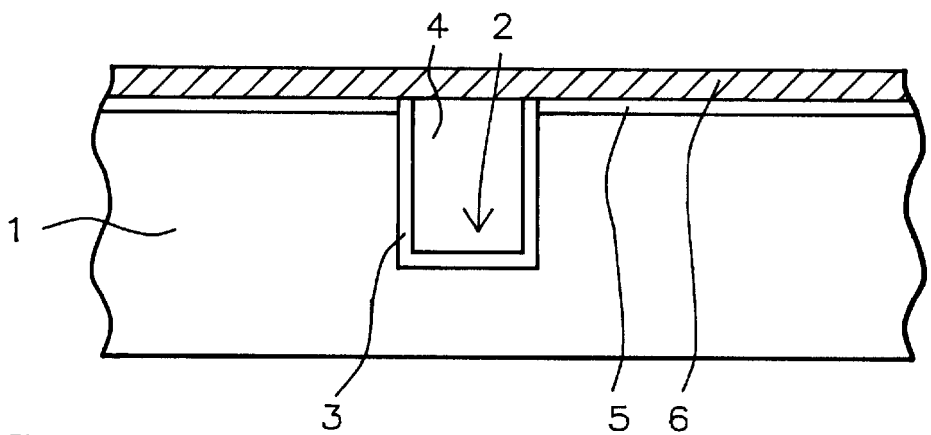
Figure 4:
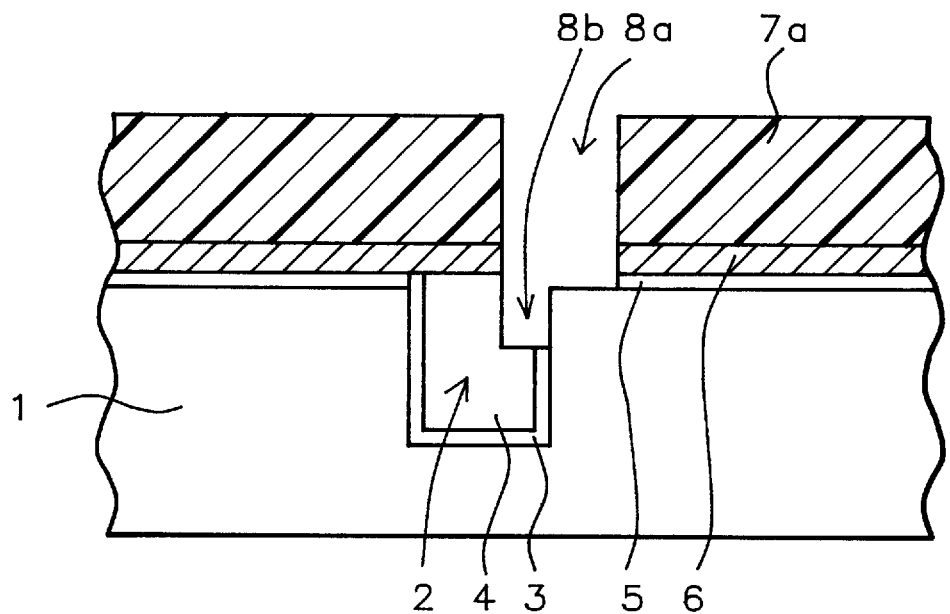

Another silicon dioxide layer 5, is thermally grown in an oxygen-steam ambient, at a temperature between about 750 to 950° C., to a thickness between about 40 to 150 Angstroms, to be used for the gate insulator layer of the MOSFET device. Next a first layer of polysilicon 6, is deposited via low pressure chemical vapor deposition, (LPCVD), procedures, at a temperature between about 500 to 650° C., to a thickness between about 300 to 1000 Angstroms. Polysilicon layer 6, schematically shown in FIG. 3, is doped using in situ doping, deposition procedures. Photoresist shape 7a, is formed, to provide the desired opening 8a, for the subsequent creation of a buried contact region. An anisotropic RIE procedure, using $Cl_2$ as an etchant for first polysilicon layer 6, allows opening 8a, to be formed in first polysilicon layer 6. A selective RIE procedure, using $CHF_3$ as an etchant for silicon dioxide, is next performed removing a portion of silicon oxide layer 4, exposed in opening 8a. This selective RIE procedure also removes the regions of silicon oxide layer 5, and silicon oxide layer 3, exposed in opening 8a, while exposed regions of semiconductor substrate 1, are not attacked in the $CHF_3$ ambient. This results in the creation of mini-trench 8b, in shallow trench 2, with a width between about 500 to 2000 Angstroms, and a depth between about 500 to 2000 Angstroms. The creation of mini-trench 8b, shown schematically in FIG. 4, exposes a side of semiconductor substrate 1, which will subsequently be used to accommodate a portion of the buried contact region.

Figure 5:
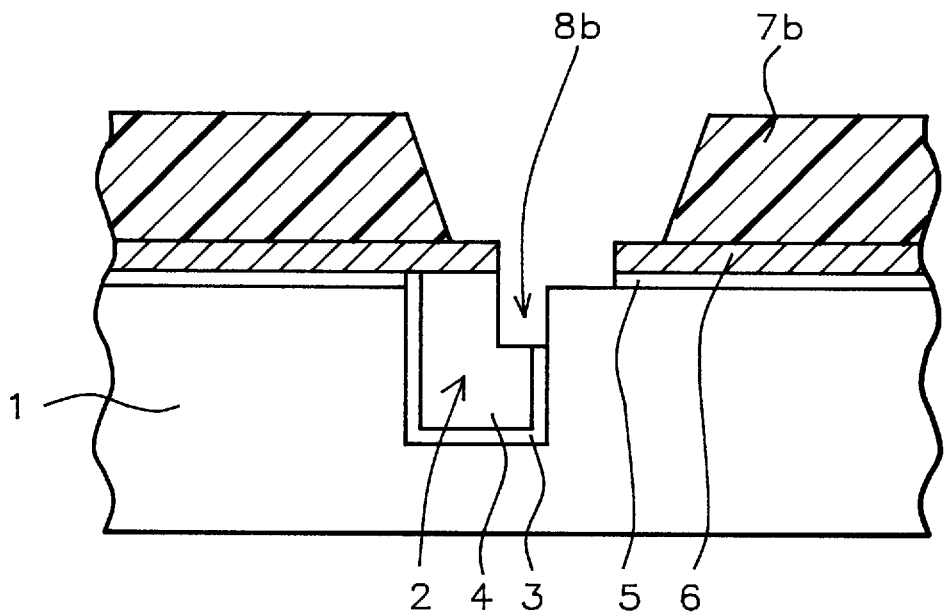
Figure 6:
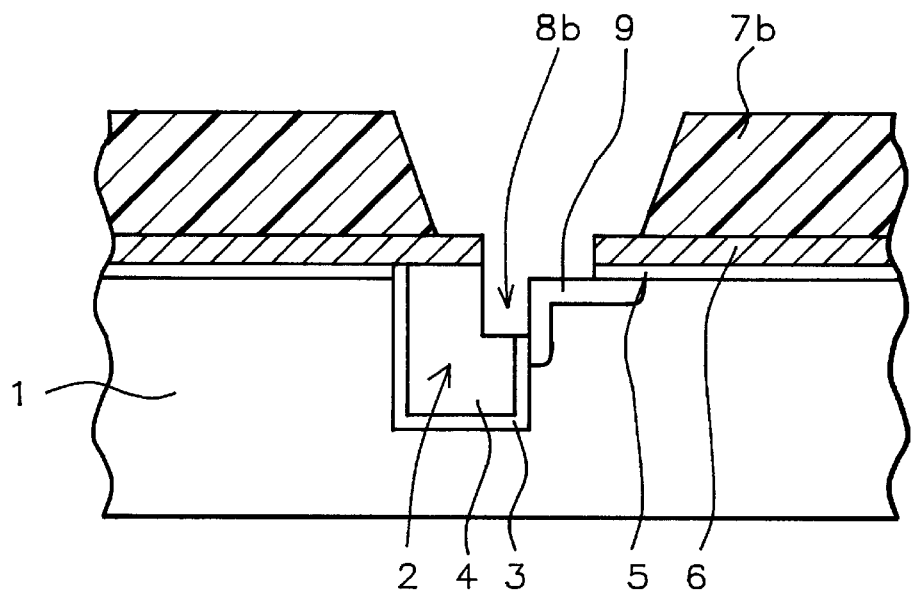

FIG. 5, shows the result of an isotropic etch back procedure, using oxygen, performed to remove between about 300 to 1000 Angstroms of photoresist shape 7a, and to widen photoresist opening 8a, while converting straight walled, photoresist shape 7a, to sloped photoresist shape 7b. This will allow a subsequent angled ion implantation procedure, to successfully place dopants, in semiconductor substrate 1, beneath the edge of first polysilicon layer 6, as well as in the region of semiconductor substrate 1, exposed along the side of mini-trench 8b. A critical ion implantation procedure, using phosphorous, at an energy between about 30 to 80 KeV, at a dose between about 1E14 to 3E15 atoms/cm$^2$, is used to create buried contact region 9, in semiconductor substrate 1. This implantation procedure is performed at an implant angle between about 15 to 45 degrees, allowing buried contact region 9, to be formed in the semiconductor substrate, along the sides of mini-trench 8b, and also allowing buried contact region 9, to extend under first polysilicon layer 6. The buried contact region, shown schematically in FIG. 6, results in increased surface area as a result of the vertical component, created in semiconductor substrate 1, along the sides of mini-trench 8b.

Figure 7:
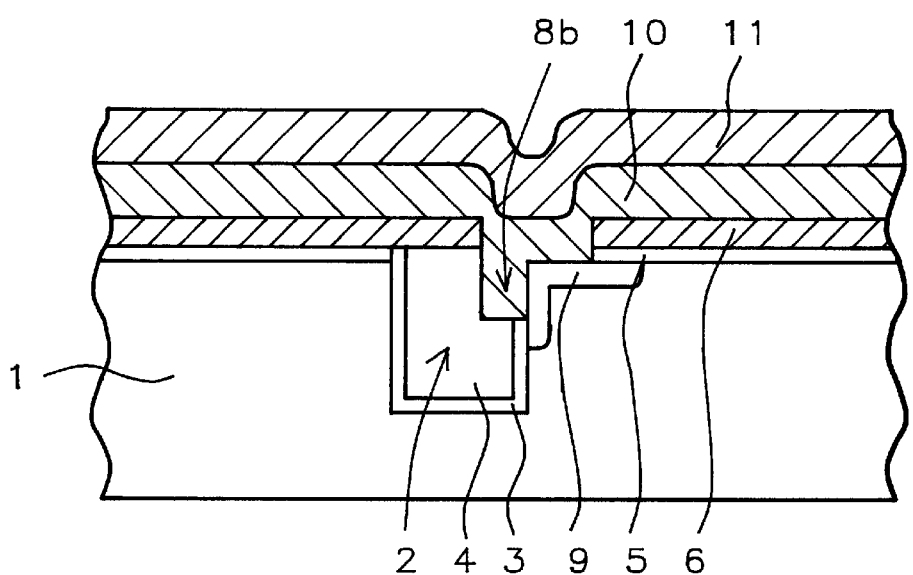
Figure 8:
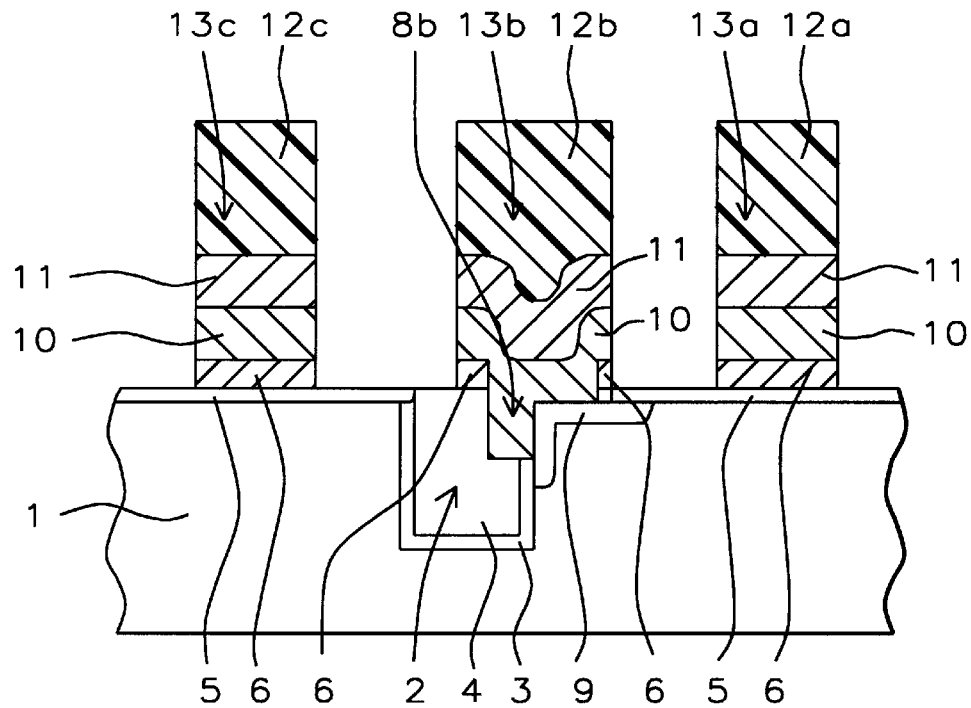

A second polysilicon layer 10, is next deposited via in situ doping, LPCVD procedures, at a temperature between about 500 to 650° C., to a thickness between about 500 to 1500 Angstroms, followed by an LPCVD deposition of tungsten silicide layer 11, at a thickness between about 750 to 1500 Angstroms. This is schematically shown in FIG. 7. Photoresist shapes 12a and 12b, are used as masks to allow patterning of tungsten silicide layer 11, second polysilicon layer 10, and first polysilicon layer 6, to be performed, via anisotropic RIE procedures, using $Cl_2$ as an etchant, creating polysilicon gate structure 13a, and polysilicon contact structure 13b. This is schematically shown in FIG. 8. The amount of contact area between polysilicon contact structure 13b, and buried contact region 9, is increased as a result of the existence of buried contact region 9, along the sides of mini-trench 8b.

Figure 9:
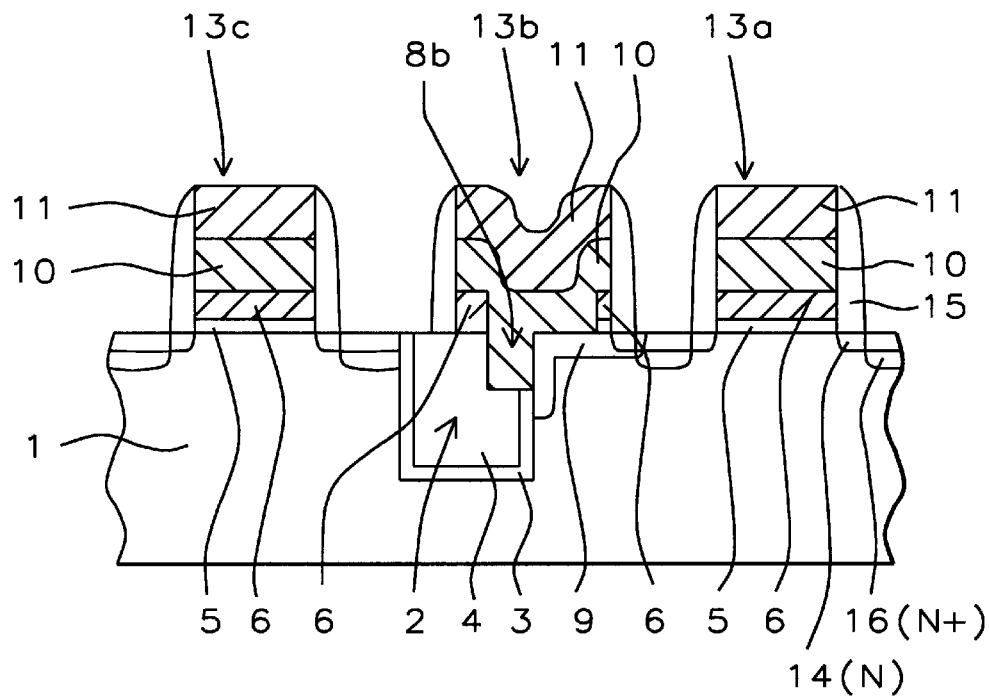

After removal of photoresist shapes 12a, 12b, and 12c, via oxygen plasma ashing and careful wet cleans, removing regions of silicon oxide layer 5, exposed between polysilicon structures, a lightly doped source and drain region 14, is formed via ion implantation of arsenic or phosphorous, at an energy between about 25 to 50 KeV, at a dose between about 1E13 to 2E14 atoms/cm$^2$. The lightly doped source and drain region 14, schematically shown in FIG. 9, provides for a conductive link between polysilicon contact structure 13b, and polysilicon gate structure 13a. A layer of silicon oxide is next deposited using LPCVD or plasma enhanced chemical vapor deposition, (PECVD), procedures, to a thickness between about 1000 to 3000 Angstroms, followed by an anisotropic, RIE procedure, using $CHF_3$ as an etchant, creating insulator spacers 15, on the sides of polysilicon gate structure 13a and polysilicon contact structure 13b. A heavily doped source and drain region 16, is next formed via ion implantation of arsenic, at an energy between about 25 to 100 KeV, at a dose between about 1E15 to 6E15 atoms/cm$^2$. This is shown schematically in FIG. 9.

While this invention has been particularly shown and described with reference to, the preferred embodiments thereof, it will be understood by those skilled in the art that various changes in form and details may be made without departing from the spirit and the scope of this invention.

What is claimed is:

1. A method of forming a buried contact region, in a MOSFET device, on a semiconductor substrate, comprising the steps of:

forming an insulator filled shallow trench in said semiconductor substrate;

growing a gate insulator layer on the surface of said semiconductor substrate, not covered by said insulator filled shallow trench;

depositing a first polysilicon layer on said gate insulator layer and on said insulator filled shallow trench;

forming a buried contact opening in said first polysilicon layer, and in said gate insulator layer, exposing a portion of the top surface of said semiconductor substrate, and exposing a region of said insulator filled shallow trench;

forming a mini-trench in said insulator filled shallow trench, by removing a portion of insulator from said insulator filled shallow trench, exposed in said buried contact opening, exposing a vertical surface of said semiconductor substrate, along the side of said mini-trench;

forming said buried contact region, in said semiconductor substrate via ion implanting a first conductivity imparting dopant into said portion of top surface of said semiconductor substrate, and into said vertical surface, of said semiconductor substrate;

depositing a second polysilicon layer on said first polysilicon layer, and on said buried contact region;

depositing a metal silicide layer on said second polysilicon layer;

forming a polysilicon gate structure, on said gate insulator layer, and forming a polysilicon contact structure, overlying said buried contact region, via patterning of said metal silicide layer, second polysilicon layer, and said first polysilicon layer;

forming a lightly doped source and drain region in said semiconductor substrate, between said polysilicon gate structure and said polysilicon contact structure;

forming insulator spacers on the sides of said polysilicon gate structure, and on the sides of said polysilicon contact structure; and forming a heavily doped source and drain region between said polysilicon gate structure and said polysilicon contact structure.

2. The method of claim 1, wherein said insulator filled shallow trench, is between about 3000 to 7000 Angstroms in depth, and between about 0.20 to 100 uM in width.

3. The method of claim 1, wherein said gate insulator layer is silicon dioxide, thermally grown in an oxygen-steam ambient, to a thickness between about 40 to 150 Angstroms.

4. The method of claim 1, wherein said first polysilicon layer is deposited using in situ doped, LPCVD procedures, to a thickness between about 300 to 1000 Angstroms.

5. The method of claim 1, wherein said buried contact opening is formed via anisotropic RIE procedures, using $Cl_2$ as an etchant for said first polysilicon layer, and using $CHF_3$ as an etchant for said gate insulator layer.

6. The method of claim 1, wherein said mini-trench, in said insulator filled shallow trench, is formed via removal of between about 500 to 2000 Angstroms of insulator, from insulator filled shallow trench, via anisotropic RIE procedures, using $CHF_3$ as an etchant.

7. The method of claim 1, wherein said first conductivity imparting dopant, used to form said buried contact region, is phosphorous, ion implanted at an energy between about 30 to 80 KeV, at a dose between about 1E14 to 3E15 atoms/$cm_2$, and using an implant angle between about 15 to 45 degrees.

8. The method of claim 1, wherein said second polysilicon layer is deposited using in situ doping, LPCVD procedures, to a thickness between about 500 to 1500 Angstroms.

9. The method of claim 1, wherein said metal silicide layer is tungsten silicide, deposited using LPCVD procedure, to a thickness between about 750 to 1500 Angstroms.

10. The method of claim 1, wherein said polysilicon contact structure, overlying said buried contact region, is formed via anisotropic RIE procedures, using $Cl_2$ as an etchant for said metal silicide layer, for said second polysilicon layer, and for said first polysilicon layer.

11. A method of forming a buried contact region, for a MOSFET device, on a semiconductor substrate, with increased contact area between a polysilicon contact structure, and the underlying buried contact region, comprising the steps of:

forming an insulator filled shallow trench region in said semiconductor substrate;

growing a gate insulator layer on the surface of said semiconductor substrate, not covered by said field oxide regions;

depositing a first polysilicon layer on said gate insulator layer and on said field oxide regions;

forming a first photoresist shape, with a first opening, on said first polysilicon layer;

forming a buried contact opening in said first polysilicon layer, and in said gate insulator layer, exposing a portion of the top surface of said semiconductor substrate, and exposing a region of said insulator filled shallow trench, in the area exposed in said first opening in said first photoresist shape;

removing a portion of said insulator, from area of said insulator filled shallow trench, exposed in said first opening in said first photoresist shape, creating a mini-trench in said insulator filled shallow trench, with a vertical surface of said semiconductor substrate, exposed along the side of the mini-trench;

isotropic etching of said first photoresist shape, creating a second photoresist shape, with a second opening;

ion implanting a first conductivity imparting dopant, into said portion of the top surface of said semiconductor substrate, and into said vertical surface of said semiconductor substrate, forming increased surface area buried contact region;

depositing a second polysilicon layer on said first polysilicon layer, and on said increased surface area buried contact region;

depositing a tungsten silicide layer on said second polysilicon layer;

patterning of said tungsten silicide layer, said second polysilicon layer, and said first polysilicon layer, to form a polysilicon gate structure on said gate insulator layer;

patterning of said tungsten silicide layer, said second polysilicon layer, and said first polysilicon layer, to form a polysilicon contact structure on said increased surface area buried contact region;

forming a lightly doped source and drain region, in said semiconductor substrate, in a region between said polysilicon contact structure, and said polysilicon gate structure;

forming insulator spacers on the sides of said polysilicon contact structure, and on the sides of said polysilicon gate structure; and forming a heavily doped source and drain region, in said semiconductor substrate, in the region between said polysilicon contact structure, and said polysilicon gate structure.

12. The method of claim 11, wherein said insulator filled shallow trench is formed to a depth between about 3000 to 7000 Angstroms, with a width between about 0.20 to 100 uM, Angstroms, and filled with LPCVD or PECVD deposited silicon oxide.

13. The method of claim 11, wherein said gate insulator layer is silicon dioxide, thermally grown in an oxygen steam ambient, to a thickness between about 40 to 150 Angstroms.

14. The method of claim 11, wherein said first polysilicon layer is deposited using in situ doped, LPCVD procedures, to a thickness between about 300 to 1000 Angstroms.

15. The method of claim 11, wherein said buried contact opening is formed in the region of said first polysilicon layer, and in said gate insulator layer, exposed in said first opening, in said first photoresist shape, via anisotropic RIE, using $Cl_2$ as an etchant for said first polysilicon layer, and using $CHF_3$ as an etchant for said gate insulator layer.

16. The method of claim 11, wherein said mini-trench, in said insulator filled shallow trench, is formed via removal of between about 500 to 2000 Angstroms of insulator, via anisotropic RIE procedures, using $CHF_3$ as an etchant, in a region of said insulator filled trench, exposed in said buried contact opening.

17. The method of claim 11, wherein said second opening, in said second photoresist shape, is created by removing between about 300 to 1000 Angstroms of photoresist, from said first photoresist shape, using oxygen, isotopic, dry etching procedures.

18. The method of claim 11, wherein said first conductivity imparting dopant, used to create said increased surface area buried contact region, in said top surface of said semiconductor substrate, and in said vertical surface of said semiconductor substrate, is phosphorous, ion implanted at an energy between about 30 to 80 KeV, at a dose between about 1E14 to 3E15 atoms/$cm^2$, and at an implant angle between about 15 to 45 degrees.

19. The method of claim 11, wherein said second polysilicon layer is deposited using in situ doped, LPCVD procedures, to a thickness between about 500 to 1500 Angstroms.

20. The method of claim 11, wherein said tungsten silicide layer is deposited using LPCVD procedures, to a thickness between about 750 to 1500 Angstroms.

21. The method of claim 11, wherein said polysilicon gate structure, on said gate insulator layer, is formed via anisotropic RIE procedures, using $Cl_2$ as an etchant for said tungsten silicide layer, for said second polysilicon layer, and for said first polysilicon layer.

22. The method of claim 11, wherein said polysilicon contact structure, overlying said increased surface area buried contact region, is formed via anisotropic RIE procedures, using $Cl_2$ as an etchant for said tungsten silicide layer, for said second polysilicon layer, and for said first polysilicon layer.

* * * * *